(12) United States Patent
Chen et al.

(10) Patent No.: US 12,451,460 B2
(45) Date of Patent: Oct. 21, 2025

(54) WAFER BONDING APPARATUS AND METHOD

(71) Applicant: YANGTZE MEMORY TECHNOLOGIES CO., LTD., Wuhan (CN)

(72) Inventors: Guoliang Chen, Wuhan (CN); Mengyong Liu, Wuhan (CN); Yang Liu, Wuhan (CN); Wu Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 18/582,381

(22) Filed: Feb. 20, 2024

(65) Prior Publication Data
US 2024/0194637 A1 Jun. 13, 2024

Related U.S. Application Data

(60) Division of application No. 17/681,161, filed on Feb. 25, 2022, now Pat. No. 11,955,454, which is a
(Continued)

(51) Int. Cl.
*H01L 23/00* (2006.01)
*H01L 21/68* (2006.01)
*H01L 23/544* (2006.01)

(52) U.S. Cl.
CPC ............ *H01L 24/80* (2013.01); *H01L 21/681* (2013.01); *H01L 23/544* (2013.01); *H01L 24/74* (2013.01);
(Continued)

(58) Field of Classification Search
CPC ..... H01L 23/544; H01L 21/681; H01L 24/80; H01L 2223/54426
See application file for complete search history.

(56) References Cited

U.S. PATENT DOCUMENTS

| 5,236,118 A | 8/1993 | Bower et al. |
|---|---|---|
| 7,371,663 B2 | 5/2008 | Chen et al. |

(Continued)

FOREIGN PATENT DOCUMENTS

| CN | 109904105 A | 6/2019 |
|---|---|---|
| CN | 110634728 A | 12/2019 |

(Continued)

*Primary Examiner* — David A Zarneke
(74) *Attorney, Agent, or Firm* — BAYES PLLC

(57) ABSTRACT

An apparatus for wafer bonding includes a first bearing table configured to hold a first wafer provided with at least one first alignment mark; a second bearing table, opposite to the first bearing table, and configured to hold a second wafer provided with at least one second alignment mark; an alignment component, located on at least a side of the first or second bearing table, and configured to determine first and second position parameters of the first and second alignment marks, respectively, by using an optical beam; a mobile component, connected to the first and second bearing tables, and configured to adjust, according to the first an second position parameters, a relative position between the first and second wafers until a relative position between the first and second alignment marks satisfies a predetermined bonding condition; and a bonding component, connected to the first and second bearing tables, and configured to bond the first wafer to the second wafer.

18 Claims, 14 Drawing Sheets

Related U.S. Application Data continuation of application No. PCT/CN2021/126160, filed on Oct. 25, 2021.

(52) U.S. Cl.
CPC ............. *H01L 2223/54426* (2013.01); *H01L 2224/80123* (2013.01); *H01L 2224/80129* (2013.01); *H01L 2224/8013* (2013.01); *H01L 2224/80895* (2013.01); *H01L 2924/1438* (2013.01)

(56) References Cited

U.S. PATENT DOCUMENTS

| | | |
|---|---|---|
| 7,442,476 B2 | 10/2008 | Best et al. |
| 7,682,933 B1 * | 3/2010 | Loomis .................. H01L 25/50 |
| | | 438/455 |
| 7,998,833 B2 | 8/2011 | Thallner |
| 8,244,399 B2 * | 8/2012 | Maeda .................. H01L 21/68 |
| | | 414/217 |
| 8,489,225 B2 | 7/2013 | Xin et al. |
| 9,466,538 B1 | 10/2016 | Skordas et al. |
| 9,646,860 B2 | 5/2017 | Huang et al. |
| 10,636,688 B2 | 4/2020 | Wang et al. |
| 11,121,091 B2 | 9/2021 | Wagenleitner |
| 11,367,712 B2 | 6/2022 | Watanabe |
| 2006/0249859 A1 | 11/2006 | Eiles et al. |
| 2007/0252994 A1 | 11/2007 | Bijnen et al. |
| 2011/0176139 A1 | 7/2011 | Yamaguchi et al. |

FOREIGN PATENT DOCUMENTS

| | | |
|---|---|---|
| CN | 111584415 A | 8/2020 |
| CN | 111630627 A | 9/2020 |
| JP | 2020107661 A | 7/2020 |

\* cited by examiner

WAFER BONDING APPARATUS AND METHOD

CROSS-REFERENCE TO RELATED APPLICATIONS

This application is a divisional of U.S. application Ser. No. 17/681,161, filed on Feb. 25, 2022, entitled "WAFER BONDING APPARATUS AND METHOD," which is a continuation of International Application No. PCT/CN2021/126160, filed on Oct. 25, 2021, entitled "WAFER BONDING APPARATUS AND METHOD," both of which are hereby incorporated by reference in their entireties.

BACKGROUND

Embodiments of the present disclosure relate to a method and apparatus for wafer bonding.

In recent years, Flash Memory has developed rapidly. A main feature of Flash Memory is that the stored information can be maintained for a long time without power-on. Flash Memory has advantages of high integration level, fast storage speed, easy erasing and re-writability. In order to further improve the Bit Density of Flash Memory and to reduce the Bit Cost, three-dimensional Flash Memory (3D NAND Flash) technology has developed rapidly.

At present, as a new technology, wafer bonding technology is widely used in the chip manufacturing industry, particularly in the 3D NAND Flash manufacturing field. The wafer bonding technique is a process in which two wafers with different functions are directly bonded together after identifying and aligning their marks. In the related art, the optical signal utilized during the alignment process has a large interference property, and a certain position error is easily generated, which may result in bonding failure.

SUMMARY

Embodiments of the present disclosure provide a wafer bonding method, including the following operations.

A first position parameter of a first alignment mark on a first wafer is determined by using an optical beam, e.g., a transmissive optical beam.

A second position parameter of a second alignment mark on a second wafer is determined with the transmissive optical beam. Herein, the transmissive optical beam has a property of transmitting through a wafer.

A relative position between the first wafer and the second wafer is adjusted according to the first position parameter and the second position parameter with the transmissive optical beam until the relative position between the first alignment mark and the second alignment mark satisfies a predetermined bonding condition.

The first wafer and the second wafer are bonded.

In some embodiments, a relative position between the first wafer and the second wafer is adjusted according to the first position parameter and the second position parameter with the transmissive optical beam, which includes the following operations.

A distance in a vertical direction between the first wafer and the second wafer, a position in a horizontal direction of the first wafer, and a position in a horizontal direction of the second wafer are synchronously adjusted according to the first position parameter and the second position parameter with the transmissive optical beam, herein the vertical direction is perpendicular to a surface of the first wafer and/or a surface of the second wafer; the horizontal direction is parallel to the surface of the first wafer and/or the surface of the second wafer.

In some embodiments, the operation that the relative position between the first wafer and the second wafer is adjusted according to the first position parameter and the second position parameter with the transmissive optical beam, includes the following operations.

A position of the first wafer and a position of the second wafer in a horizontal direction are adjusted according to the first position parameter and the second position parameter to perform first alignment of the first alignment mark with the second alignment mark.

A distance between the first wafer and the second wafer in a vertical direction is adjusted until the distance satisfies a predetermined bonding distance.

The position of the first wafer and the position of the second wafer in a horizontal direction are adjusted with the transmissive optical beam to align the first alignment mark with the second alignment mark for a second time.

Herein, the vertical direction is perpendicular to a surface of the first wafer and/or a surface of the second wafer; the horizontal direction is parallel to the surface of the first wafer and/or the surface of the second wafer.

In some embodiments, the distance between the first wafer and the second wafer in a vertical direction is adjusted until the distance satisfies a predetermined bonding distance, which includes the following operation.

A position of the first wafer and/or a position of the second wafer are adjusted until the distance between the first wafer and the second wafer satisfies the predetermined bonding distance.

In some embodiments, the relative position between the first wafer and the second wafer is adjusted with the transmissive optical beam, which includes the following operations.

A first transmission image of the first alignment mark and the second alignment mark on a side on which the transmissive optical beam travels away from the first wafer and the second wafer is acquired.

The relative position between the first wafer and the second wafer is adjusted according to the first transmission image.

In some embodiments, the first transmission image includes:

A first projection image of the first alignment mark and a second projection image of the second alignment mark.

In some embodiments, the relative position between the first wafer and the second wafer is adjusted with the transmissive optical beam, which includes the following operations.

A first reflection image formed by reflection of the first alignment mark and the second alignment mark is acquired on a side on which the transmissive optical beam irradiates the first wafer.

The relative position between the first wafer and the second wafer is adjusted according to the first reflection image.

In some embodiments, the first reflection image includes a third projection image of the first alignment mark and a fourth projection image of the second alignment mark.

In some embodiments, the first alignment mark includes a first alignment reference point, and the second alignment mark includes a second alignment reference point. The relative position between the first alignment mark and the second alignment mark are made to satisfy the predetermined bonding condition, which includes the following operations.

A first distance between the first alignment reference point and the second alignment reference point in a first direction is made to be less than or equal to a first distance threshold; and/or a second distance between the first alignment reference point and the second alignment reference point in a second direction is made to be less than or equal to a second distance threshold.

Herein, the first direction and the second direction are parallel to the surface of the first wafer and/or the surface of the second wafer; the first direction is perpendicular to the second direction.

In some embodiments, the first alignment mark includes a first alignment reference point, and the second alignment mark includes a second alignment reference point. The relative position between the first alignment mark and the second alignment mark are made to satisfy the predetermined bonding condition, which includes the following operation.

A third distance between the first alignment reference point and the second alignment reference point in the vertical direction is made to be less than or equal to a third distance threshold.

In some embodiments, the first position parameter of the first alignment mark on the first wafer is determined with the transmissive optical beam, which includes the following operations.

The first wafer is irradiated with the transmissive optical beam.

A second transmission image formed by transmission of the transmissive optical beam at the first alignment mark is acquired.

The first position parameter is determined according to the second transmission image.

In some embodiments, the second position parameter of the second alignment mark on the second wafer is determined with the transmissive optical beam, which includes the following operations.

The first wafer and the second wafer are irradiated with the transmissive optical beam.

A third transmission image formed by transmission of the transmissive optical beam around (e.g., on or at) the second alignment mark is acquired.

The second position parameter is determined according to the third transmission image.

In some embodiments, the first position parameter of the first alignment mark on the first wafer is determined with the transmissive optical beam, which includes the following operations.

The first wafer is irradiated with the transmissive optical beam.

A second reflection image formed by reflection of the transmissive optical beam at the first alignment mark is acquired.

The first position parameter is determined according to the second reflection image.

In some embodiments, the second position parameter of the second alignment mark on the second wafer is determined with the transmissive optical beam, which includes the following operations.

The first wafer and the second wafer are irradiated with the transmissive optical beam.

A third reflection image formed by reflection of the transmissive optical beam at the second alignment mark is acquired.

The second position parameter is determined according to the third reflection image.

In some embodiments, the first position parameter is a coordinate parameter of the first wafer relative to a predetermined first coordinate system.

The second position parameter is a coordinate parameter of the second wafer relative to a predetermined second coordinate system.

In some embodiments, the transmissive optical beam is infrared light.

An embodiment of the present disclosure further provides a wafer bonding apparatus, including:

A first bearing table, configured to hold a first wafer, herein the first wafer is provided with at least one first alignment mark.

A second bearing table, opposite to the first bearing table, and configured to hold a second wafer, herein the second wafer is provided with at least one second alignment mark.

An alignment component, located on a side of the first bearing table and/or a side of the second bearing table, and configured to determine a first position parameter of the first alignment mark on the first wafer by using a transmissive optical beam. In some embodiments, the alignment component is located on both sides of the first bearing table and/or the second bearing table.

The alignment component is further configured to determine a second position parameter of the second alignment mark on the second wafer with the transmissive optical beam.

A mobile component, connected to the first bearing table and the second bearing table, and configured to adjust, according to the first position parameter and the second position parameter, a relative position between the first wafer and the second wafer until the relative position between the first alignment mark and the second alignment mark satisfies a predetermined bonding condition.

A bonding component, connected to the first bearing table and the second bearing table, and configured to bond the first wafer to the second wafer.

In some embodiments, the first bearing table includes at least one first opening at a position corresponding to the first alignment mark.

The second bearing table includes at least one second opening at a position corresponding to the second alignment mark.

In some embodiments, the alignment component includes: a first light-emitting unit, located on a side of the first bearing table or a side of the second bearing table, and configured to emit the transmissive optical beam, herein the transmissive optical beam has a property of transmitting through a wafer; and a first receiving unit, located on another side of the first bearing table or another side of the second bearing table opposite to the side on which the first light-emitting unit is located, and configured to receive the transmissive optical beam passing through the first wafer and the second wafer.

In some embodiments, the alignment component includes: a second light-emitting unit, located on a side of the first bearing table or a side of the second bearing table, and configured to emit the transmissive optical beam, herein the transmissive optical beam has a property of transmitting through a wafer; and a second receiving unit, located on the side of the first bearing table or the side of the second bearing table as same as the side on which the second light-emitting unit is located, and configured to receive the transmissive optical beam reflected at the first alignment mark and the second alignment mark.

The embodiments of the present disclosure provide a method and apparatus for wafer bonding. The method may determine position parameters of a first wafer and a second wafer to be bonded by using a transmissive optical beam having a capability of transmitting through a wafer, and align wafers by using the transmission optical beam when the wafers are at a relative position to be bonded. Thus, on one hand, the process steps that need to be operated in the wafer alignment process are reduced, and position errors generated in the wafer movement process are reduced; on the other hand, the anti-interference performance of the signal and the definition of the optical imaging can be improved by using the transmission optical beam for alignment, thereby improving the accuracy of the wafer bonding and the reliability product.

BRIEF DESCRIPTION OF THE DRAWINGS

One or more embodiments are illustrated by the corresponding drawings. Unless otherwise stated, the drawings do not constitute scale limitations.

DETAILED DESCRIPTION

Figure 1:
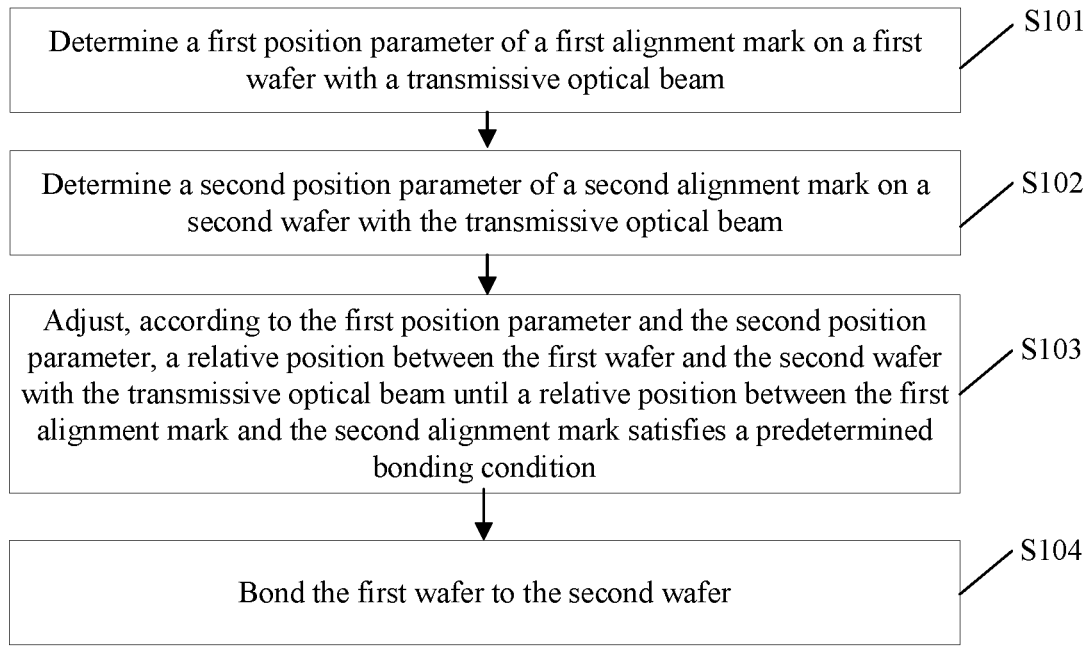
FIG. 1 is a flowchart of a wafer bonding method according to an embodiment of the present disclosure.

Exemplary embodiments of the present disclosure will be described below in detail with reference to the accompanying drawings. Although exemplary embodiments of the present disclosure are illustrated in the accompanying drawings, it should be understood that the present disclosure may be implemented in various forms without being limited by the specific embodiments described herein. On the contrary, these embodiments are provided to enable a more thorough understanding of the present disclosure and to fully convey the scope of the present disclosure to those skilled in the art.

The spatial relationship terms such as "under", "below", "on" and "above" etc. may be used herein for convenience of description to describe the relationship between one element or feature shown in the drawings and other elements or features. It should be understood that, in addition to the orientation shown in the drawings, spatial relationship terms are intended to include different orientations of devices in use and operation. For example, when the apparatus in the drawings is turned, the element or feature described as "under" or "below" other elements will be described as "on" or "above" other elements. Thus, the exemplary terms "under" and "above" may include upper and lower orientations. Furthermore, the device may be oriented (rotated 90 degrees or otherwise) and the spatial relationship terms used herein are explained accordingly.

The terms used herein are intended only to describe specific embodiments and are not a limitation of the present disclosure. When used herein, the singular terms "a/an", "one" and "the" are also intended to include the plural forms unless the context clearly indicates otherwise. It should also be appreciated that, when used in the detailed description, the terms "comprise" and/or "include" determine the existence of the features, integers, steps, operations, elements and/or components, but do not exclude the existence or addition of one or more other features, integers, steps, operations, elements, components and/or groups. When used herein, the term "and/or" includes any and all combinations of the related listed items.

In order to fully understand the present disclosure, detailed operations and structures will be proposed in the following description to illustrate the technical solution of the present disclosure. Detailed descriptions of the embodiments of the present disclosure are as follows. However, in addition to these detailed descriptions, the present disclosure may also have other embodiments.

As shown in FIG. 1, an embodiment of the present disclosure provides a wafer bonding method, including the following operations.

At block S101, a first position parameter of a first alignment mark on a first wafer is determined by using a transmissive optical beam.

At block S102, a second position parameter of a second alignment mark on a second wafer is determined with the transmissive optical beam. Herein, the transmissive optical beam emerges (e.g., travels away) from the first wafer and/or the second wafer.

At block S103, a relative position between the first wafer and the second wafer is adjusted according to the first position parameter and the second position parameter with the transmissive optical beam until the relative position between the first alignment mark and the second alignment mark satisfies a predetermined bonding condition.

At block S104, the first wafer and the second wafer are bonded.

It should be noted that the first wafer and the second wafer in the embodiments of the present disclosure may be determined according to practical production requirements. Here, the wafer may be a single-crystal silicon wafer used for manufacturing a semiconductor circuit, a silicon wafer on which a device or a circuit is mounted after processing, or a chip substrate made of other materials known to those skilled in the art.

The alignment process during wafer bonding may be achieved by optical alignment. Specifically, the alignment of wafers can be achieved by positioning one wafer relative to another and aligning the two wafers with alignment marks observed with an optical objective lens. For example, in the embodiments of the present disclosure, the observation may be performed by a Charge Coupled Device (CCD) observation mirror. The CCD observation mirror here and the optical source may be integrated or may be provided separately. The optical source may be configured to emit the transmissive optical beam, and the CCD may be configured to receive the transmissive optical beam.

Figure 2A:
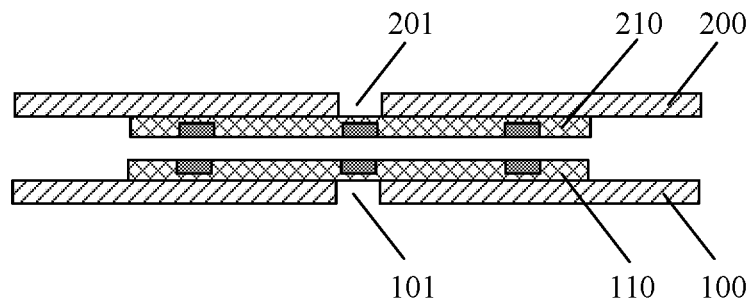
FIG. 2A is an optional structural diagram of a bearing table for holding wafers according to an embodiment of the present disclosure.

As shown in FIG. 2A, the first wafer 110 and the second wafer 210 of the embodiment may be held on the corresponding first bearing table 100 and the corresponding second bearing table 200. The above-mentioned bearing tables may include, but are not limited to, a vacuum chuck, a chuck, a robot arm, or the like. The bearing tables may move freely as required so that the relative position of the first wafer 110 and the second wafer 210 may be adjusted to achieve the alignment, or the first wafer and the second wafer may be moved relatively to achieve the bonding. Further, at least one first opening 101 may be provided on the first bearing table 100 and at least one second opening 201 may be provided on the second bearing table 200, so that the transmissive optical beam may irradiate the surface of the first wafer and/or the surface of the second wafer through the opening. Here, the opening corresponds to a first alignment mark on the first wafer or a second alignment mark on the second wafer, and one opening may correspond to one alignment mark and a group of optical elements. The opening may allow the transmissive optical beam to sufficiently irradiate the surface of the first wafer and/or the second wafer, and the first alignment marks and the second alignment marks may be exposed within the coverage area of the opening so that the corresponding alignment mark can be sufficiently observed through the observation mirror. Furthermore, after the first wafer and the second wafer are placed on the bearing table respectively, the alignment marks need to be positioned within the coverage area of the opening, and may be positioned at the center or any position of the opening as long as they can be recognized through the observation mirror.

Figure 2B:
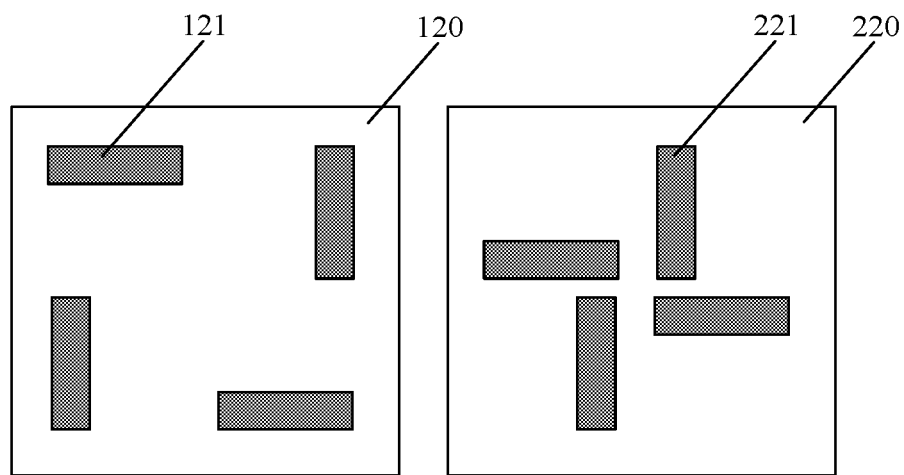
FIG. 2B is an optional structural diagram of a first alignment mark and a second alignment mark according to an embodiment of the present disclosure.

In the embodiments of the present disclosure, the first wafer and the second wafer may be aligned with the transmissive optical beam. The transmissive optical beam herein, such as an infrared beam, an ultraviolet beam, or other transmissive optical beam, may pass through a first wafer and a second wafer. It should be noted that patterned alignment marks may be provided on both the first wafer and the second wafer, and the alignment marks may include a part that allows light to pass through and an opaque part. Here the opaque part may be made of metal, ceramic, or other opaque materials and the part that allows light to pass through may be hollow out and expose the wafer surface without covering the opaque material. As shown in FIG. 2B, the first alignment mark 120 of the first wafer may include multiple opaque patterns 121 and the second alignment mark 220 of the second wafer may include multiple opaque patterns 221. The sizes (e.g., circumference, surface area, shape, etc.) of the multiple opaque patterns 121 and the multiple opaque patterns 221 are the same or different. Furthermore, the opaque patterns of the first alignment mark may be axisymmetric or centrally symmetric patterns and have a first alignment reference point, which may be a symmetric center of the patterns, or an intersection point of edges for easy identification; the opaque patterns of the second alignment mark may be symmetric patterns and have a second alignment reference point. Moreover, the projection of the alignment reference points of both the first alignment mark and the second alignment mark in the observation mirror may be acquired through the observation mirror, and it can be determined whether the first wafer is aligned with the second wafer by determining whether the relative position of the two alignment reference points projected in the observation mirror reaches a predetermined position range. For example, the relative position of the first alignment reference point and the second alignment reference point may be observed during movement of the wafers. The alignment may be stopped, and the bonding may be performed when the first wafer and the second wafer satisfy bonding conditions.

Figure 2C:
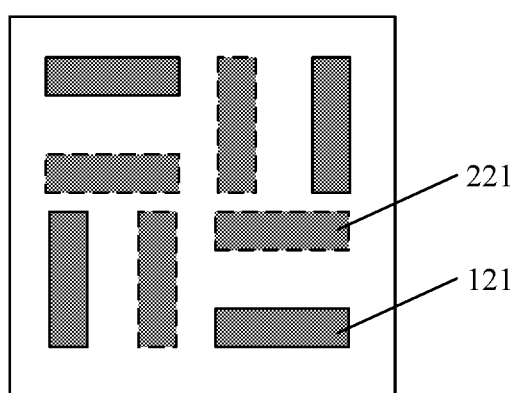
FIG. 2C is an optional structural diagram of a reflection image in an observation mirror according to an embodiment of the present disclosure.

For example, the projection image obtained in the observation mirror may be as shown in FIG. 2C. The first alignment mark may have multiple opaque patterns 121 and the second alignment mark may have multiple opaque patterns 221. Portions other than the opaque pattern are portions that allow light to pass through. For example, in some implementations, the optical source and the observation mirror are located on the same side of the first bearing table and the second bearing table, and the second alignment mark is closer to the observation mirror than the first alignment mark, a portion of the transmissive optical beam emitted by the optical source will irradiate the opaque portion of the second alignment mark and be reflected back to the observation mirror; another portion of the transmissive optical beam will irradiate the portion that allow light to pass through of the second alignment mark, pass through the second wafer, irradiate the opaque portion of the first alignment mark and be reflected back to the observation mirror. Thus, the projection image formed by reflection of both the first alignment mark and the second alignment mark can be acquired in the observation mirror. In some implementations, the optical source and the observation mirror are located on different sides of the first bearing table and the second bearing table, and the first alignment mark is closer to the optical source than the second alignment mark, the transmissive optical beam emitted by the optical source will irradiate the portion that allow light to pass through of the first alignment mark and irradiate the portion that allow light to pass through of the second alignment mark so as to be received by the observation mirror after passing through the first wafer and the second wafer. Thus, the transmission image of the first alignment mark and the second alignment mark can be acquired in the observation mirror.

The alignment reference points of the first alignment mark and the second alignment mark in the embodiment of the present disclosure may be determined according to actual production requirements. Multiple first alignment reference points and corresponding second alignment reference points may be selected for calculation of relative position parameters, so that alignment accuracy can be increased to improve product reliability.

It should be noted that the observation mentioned herein may be an automatic detection. For example, an alignment reference point of the first alignment mark and an alignment reference point of the second alignment mark in the observation mirror are detected by image recognition technology, and the automatic position detection is realized.

In some embodiments, the first position parameter of the first alignment mark on the first wafer is determined with the transmissive optical beam, which includes the following operations.

The first wafer is irradiated with the transmissive optical beam.

A second transmission image formed by transmission of the transmissive optical beam at the first alignment mark is acquired.

The first position parameter is determined according to the second transmission image.

Figure 3:
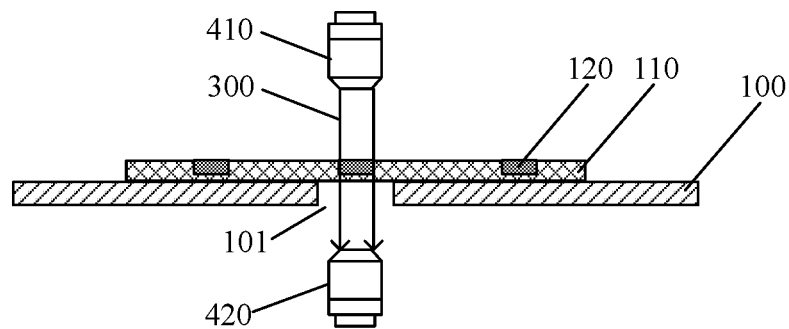
FIG. 3 is an optional structural diagram of determining a first position parameter according to an embodiment of the present disclosure.
Figure 4:
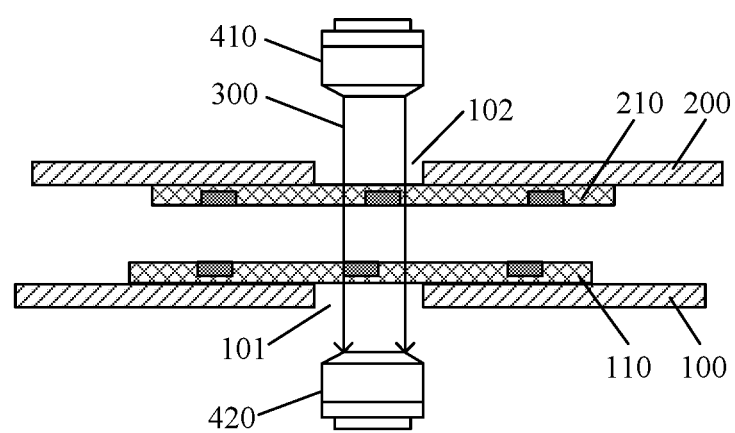
FIG. 4 is an optional structural diagram of determining a second position parameter according to an embodiment of the present disclosure.
Figure 5:
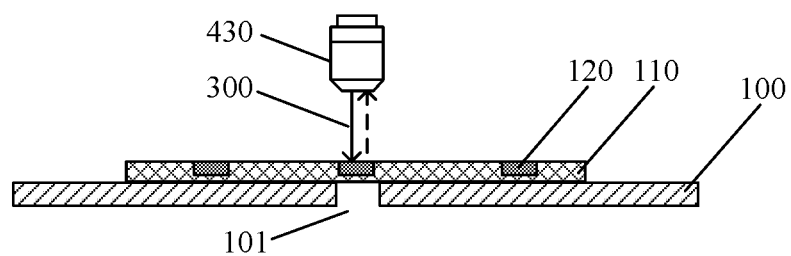
FIG. 5 is an optional structural diagram of determining a first position parameter according to an embodiment of the present disclosure.

In the embodiment of the present disclosure, as shown in FIG. 3, a fixed optical source 410 may be placed on a side on which the first bearing table 100 bears the first wafer 110 for emitting the transmissive optical beam 300. The transmissive optical beam 300 here may be uniform parallel light, that is, optical beams that attenuate less and are parallel to each other in a direction perpendicular to the surface of the first wafer 110. In this way, the transmissive optical beam emitted may irradiate the first wafer, pass the first wafer 110 and be received by the observation mirror 420 on the side opposite to the bearing surface after passing through the first opening 101. Since the transmissive optical beam cannot pass through the first alignment mark, the transmission image of the first alignment mark, that is, the second transmission image, can be acquired in the observation mirror 420. Then, it is possible to determine whether the dots on the first wafer are located on the same optical axis as the optical source and the observation mirror, that is, whether the dots are aligned according to the second transmission image, and to determine the first position parameter.

It should be noted that the optical source and the observation mirror can be interchanged, that is, the transmissive optical beam is emitted by the optical source, irradiated onto the first wafer through the first opening, and received by the observation mirror after passing through the first wafer. Furthermore, after the first position parameter of the first alignment mark on the first wafer is determined, the first wafer can be fixed at the above-mentioned position by the first bearing table, so that only the position of the second wafer can be moved during subsequent alignment and bonding processes to complete the operation. Thus, the errors caused by wafer movement can be reduced and the product reliability can be improved.

In some embodiments, the second position parameter of the second alignment mark on the second wafer is determined with the transmissive optical beam, which includes the following operations.

The first wafer and the second wafer are irradiated with the transmissive optical beam.

A third reflection image formed by reflection of the transmissive optical beam at the second alignment mark is acquired.

The second position parameter is determined according to the third reflection image.

In the embodiment of the present disclosure, for example, after the first wafer 110 is aligned, the second wafer 210 may be moved to a position opposite to the first wafer 110 by controlling the second bearing table 200, and the transmissive optical beam 300 may be emitted by the optical source. Thus, the transmissive optical beam 300 may irradiate the second wafer 210 through the second opening 102, pass through the first wafer 110 and the second wafer 210, and finally enter the observation mirror 420 through the first opening 101. Since neither the first alignment mark nor the second alignment mark can transmit the transmissive optical beam, the transmission image formed at the second alignment mark, that is, the third transmission image, can be acquired in the observation mirror. It may be determined whether the second wafer is aligned with the first wafer according to the third transmission image, and the second position parameter may be determined.

It should be noted that the first wafer in the embodiment of the present disclosure may be held on any surface of the first bearing table, and accordingly, the second wafer may be fixed to a side of the second bearing table opposite to the first wafer. On the other hand, in the process of aligning the first wafer with the second wafer, the first wafer can be held stationary and only the second wafer can be moved; the second wafer can be held stationary and only the first wafer can be moved. Furthermore, the above-mentioned process of aligning the first wafer and the second wafer is not sequential, that is, the first wafer may be first aligned, and then the second wafer may be aligned with the first wafer. Alternatively, the second wafer may be first aligned, and then the first wafer may be aligned with the second wafer. The first wafer and the second wafer can also be aligned synchronously. In this way, the steps for alignment can be reduced; the time for alignment can be saved; the position error generated during the wafer movement can be reduced, and the bonding reliability can be improved.

In the embodiment of the present disclosure, the optical source or observation mirror is used to detect whether a first alignment mark and a second alignment mark are aligned at corresponding positions thereof. When there are multiple first alignment marks on the first wafer, it is necessary to provide multiple sets of optical sources and observation mirrors or multiple first wafer alignment lenses integrated with optical sources and observation mirrors to perform the alignment detection for the first alignment marks at their respective positions.

In some embodiments, the first position parameter of the first alignment mark on the first wafer is determined with the transmissive optical beam, which includes the following operations.

The first wafer is irradiated with the transmissive optical beam.

A second reflection image formed by reflection of the transmissive optical beam at the first alignment mark is acquired.

The first position parameter is determined according to the second reflection image.

In the embodiment of the present disclosure, the optical source 410 and the observation mirror 420 may be integrated into the same integrated lens 430. For example, the integrated lens 430 is placed on a side on which the first bearing table 100 bears the first wafer 110. The transmissive optical beam 300 may be emitted by the integrated lens 430, irradiated onto the first wafer 110, reflected at the first alignment mark 120 and received by the integrated lens 430. Here, the reflection image formed by the reflection at the first alignment mark 120, that is, the second reflection image can be acquired in the integrated lens 430. Then, it is possible to determine whether the first wafer is aligned with the integrated lens 430 according to the second reflection image, and to determine the first position parameter.

It should be noted that the integrated lens may be located on the side on which the first bearing table bears the first wafer, or may be located on a side of the first bearing table opposite to the bearing surface. Similarly, after the first position parameters of the first alignment marks on the first wafer is determined, the first bearing table can be controlled to hold the first wafer at the above-mentioned position, so that only the position of the second wafer can be moved during subsequent alignment and bonding processes to complete the operation. Thus, the errors caused by wafer movement can be moved and the product reliability can be improved.

In some embodiments, the second position parameter of the second alignment mark on the second wafer is determined with the transmissive optical beam, which includes the following operations.

The first wafer and the second wafer are irradiated with the transmissive optical beam.

A third reflection image formed by reflection of the transmissive optical beam at the second alignment mark is acquired.

The second position parameter is determined according to the third reflection image.

Figure 6:
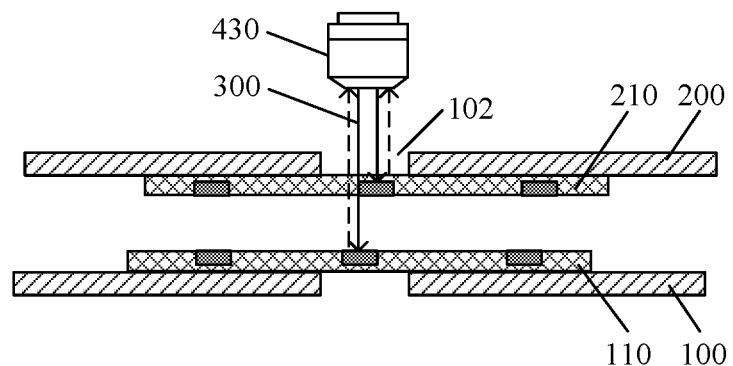
FIG. 6 is an optional structural diagram for determining a second position parameter according to an embodiment of the present disclosure.

In the embodiment of the present disclosure, for example, as shown in FIG. 6, after alignment of the first wafer 110, the second wafer 210 may be moved to the opposing position of the first wafer 110 by controlling the second bearing table 200, and the transmissive optical beam 300 may be emitted by the integrated lens 430. Thus, the transmissive optical beam 300 may irradiate onto the second wafer 210 through the second opening, may be reflected at the first alignment mark and the second alignment mark, and finally received by the integrated lens 430 after passing through the second opening 102. In this way, the reflection image formed by reflection at the second alignment mark, that is, the third reflection image, can be acquired in the integrated lens 430. Then, it is possible to determine whether the second wafer is aligned with the first wafer according to the third reflection image, and to determine the second position parameter.

In the embodiment of the present disclosure, the position parameters of the first wafer and the second wafer can be determined in two ways, i.e., the transmission image and the reflective image, and one of the wafers can be fixed and the other wafer can be moved. Thus, the steps of alignment can be reduced to reduce position error caused by multiple wafer movements, and to improve the alignment accuracy.

In some embodiments, the first position parameter is a coordinate parameter of the first wafer relative to a predetermined first coordinate system.

The second position parameter is a coordinate parameter of the second wafer relative to a predetermined second coordinate system.

In the embodiment of the present disclosure, the first position parameter and the second position parameter may be coordinate parameters. Specifically, the reference origin of the predetermined first coordinate system may be an optical source or an observation mirror configured to align the first wafer, and the above-described first coordinate system may be established. The first coordinate system herein may be a spatial rectangular coordinate system, that is, a plane parallel to the first wafer is the xy plane of the coordinate system, and a direction perpendicular to the first wafer is the z axis. At this time, the process of aligning the first wafer is actually a process of moving the first alignment mark to a corresponding coordinate point, and the first position parameter is a coordinate parameter of a predetermined position. Here, the first position parameter can be selected according to the distance between the lens and the first wafer and other actual requirements, and the alignment process is to move the center of the alignment mark in the reflection image onto the z-axis.

Similarly, the second coordinate system may also be a spatial rectangular coordinate system, of which the coordinate origin is an integrated lens configured to align the second wafer. Therefore, the second position parameter here can also be selected according to the distance between the integrated lens and the second wafer and other actual requirements.

It should be noted that the projection of the first alignment mark in the xy plane may have a first alignment reference point and the projection of the second alignment mark in the xy plane may have a second alignment reference point. Here, the first alignment reference point is determined relative to the pattern of the first alignment mark and the second alignment reference point is determined relative to the pattern of the second alignment mark. For example, when the first alignment mark is a single uniform pattern, the first alignment reference point is the center of the pattern; when the first alignment marks are multiple patterns, the first alignment reference point is the center of the multiple patterns, and the same applies for the second alignment reference point. Here, the first alignment reference point and the second alignment reference point obtained in the observation mirror may be located at the same coordinate position, or may be located at different coordinate positions, and whether the first wafer is aligned with the second wafer or not needs to be determined according to the actual predetermined alignment condition.

In the embodiments of the present disclosure, the coordinate parameters are employed to determine the positions of the alignment marks, and the direction and distance of movement of the first alignment can be determined.

In some embodiments, a relative position between the first wafer and the second wafer is adjusted according to the first position parameter and the second position parameter with the transmissive optical beam, which includes the following operations.

A distance in a vertical direction between the first wafer and the second wafer, a position in a horizontal direction of the first wafer, and a position in a horizontal direction of the second wafer are synchronously adjusted according to the first position parameter and the second position parameter with the transmissive optical beam. Herein, the vertical direction is perpendicular to a surface of the first wafer and/or a surface of the second wafer; the horizontal direction is parallel to the surface of the first wafer and/or the surface of the second wafer.

The position parameter in the embodiment of the present disclosure may be a coordinate parameter acquired in a plane of the observation mirror, and the plane of the observation mirror is parallel to the surface of the first wafer and/or the second wafer. Therefore, the corresponding relative position parameter is also a relative coordinate parameter in the direction parallel to the first wafer and/or the second wafer. For example, when the first bearing table and the second bearing table are located in the horizontal direction, the direction parallel to the first wafer and/or the second wafer is the horizontal direction, and the direction perpendicular to the first wafer and/or the second wafer is the vertical direction.

While the relative position between the first wafer and the second wafer is being adjusted, a real-time alignment operation may be performed with the transmissive optical beam. Here, the real-time alignment operation means that the position coordinates of the first alignment mark and the second alignment mark in the direction parallel to the first wafer and/or the second wafer can be continuously acquired in the observation mirror during the adjustment process, and the adjustment of the first bearing table and/or the second bearing table in the direction parallel to the first wafer and/or the second wafer can be controlled in real-time according to the relative position parameter corresponding to the position coordinates of the first alignment mark and the second alignment mark. It should be noted that when the first bearing table and the second bearing table are located in the horizontal direction, the adjustment process includes aligning the first wafer and the second wafer in the horizontal direction and making the relative distance between the first wafer and the second wafer to in the vertical direction until the relative distance satisfies the predetermined bonding distance. The above operations may be performed synchronously, that is, the relative position between the first wafer and the second wafer may be adjusted in the horizontal direction to meet the predetermined bonding conditions while reducing the relative distance between the first wafer and the second wafer in the vertical direction.

In the embodiment of the present disclosure, alignment detection and dynamic adjustment can be performed in real time with the transmissive optical beam to reduce the alignment error caused during the process of moving the wafer in the vertical direction so as to improve the alignment accuracy and product reliability.

In some embodiments, the relative position between the first wafer and the second wafer is adjusted according to the first position parameter and the second position parameter with the transmissive optical beam, which includes the following operations.

A position of the first wafer and a position of the second wafer in a horizontal direction are adjusted according to the first position parameter and the second position parameter to perform first alignment of the first alignment mark with the second alignment mark.

A distance between the first wafer and the second wafer in a vertical direction is adjusted until the distance satisfies a predetermined bonding distance.

The position of the first wafer and the position of the second wafer in a horizontal direction are adjusted with the transmissive optical beam to align the first alignment mark with the second alignment mark for a second time.

Herein the vertical direction is perpendicular to a surface of the first wafer and/or a surface of the second wafer; the horizontal direction is parallel to the surface of the first wafer and/or the surface of the second wafer.

Figure 7:
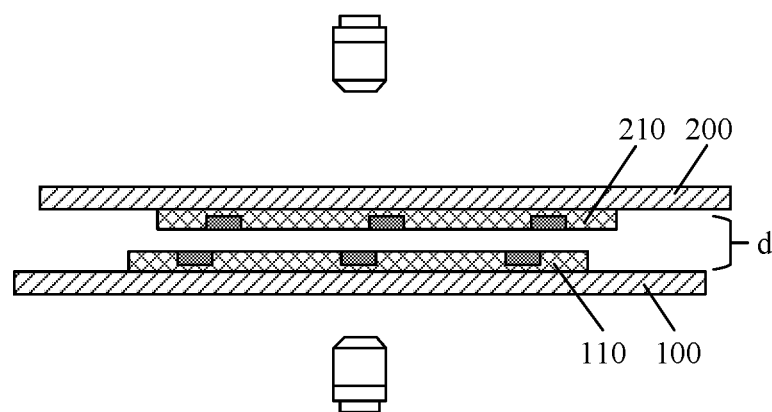
FIG. 7 is a structural diagram of a position error generated in the related art.

In the embodiments of the present disclosure, when the first coordinate system and the second coordinate system do not coincide, position compensation is required, that is, the relative position between the first wafer and the second wafer is adjusted until first alignment of the first alignment mark with the second alignment mark are completed. For example, when the first bearing table and the second bearing table are located in the horizontal direction (xy plane), the first wafer may be fixed and the second wafer may be moved in the horizontal direction with the transmissive optical beam; or the second wafer may be fixed and the first wafer may be moved in the horizontal direction until the first alignment reference point and the second alignment reference point satisfy the alignment conditions of the first alignment. Furthermore, after the first alignment is completed, the second wafer and the first wafer may be adjusted continuously until the relative distance in z direction of the coordinate axis is less than or equal to the bonding distance, so that a predetermined bonding condition may be satisfied. However, as shown in FIG. 7, in the related art, a certain position deviation may occur in the process of moving the second wafer 210 until the predetermined bonding conditions are satisfied (the relative distance is less than or equal to the bonding distance d), that is, the first coordinate system and the second coordinate system no longer coincide, which may reduce the bonding effect and affect the product performance. Therefore, in the above-described process of the embodiment of the present disclosure, the transmissive optical beam may be used for alignment, so that the alignment accuracy can be greatly increased, and the product reliability can be improved.

It should be noted that the relative position parameter in this embodiment of the present disclosure is also determined based on the coordinate parameters of the above-mentioned first coordinate system and second coordinate system. The position parameter of the first alignment mark can still be determined based on the first coordinate system, and the position parameter of the second alignment mark can still be determined based on the second coordinate system.

In the embodiments of the present disclosure, the first alignment is a process of moving the bonding surface of the first wafer and the bonding surface of the second wafer to the relative position. During the process of the second alignment, the relative position error due to the relative distance change is reduce based on the fact that the bonding surface of the first wafer and the bonding surface of the second wafer are opposite to each other, and second adjustment of the first alignment reference point and the second alignment reference point is performed to meet the alignment conditions before the bonding operation. After the first alignment in the embodiments of the present disclosure, the optical source may be turned off for the adjustment of the relative distance between the first wafer and the second wafer. The optical source may be turned on before bonding operation, and the relative position between the first wafer and the second wafer are adjusted by using the second type of optical beam to perform the second alignment, which may reduce the use of optical sources, save costs and improve the bonding accuracy.

In some embodiments, the distance between the first wafer and the second wafer in a vertical direction is adjusted until the distance satisfies a predetermined bonding distance, which includes the following operation.

A position of the first wafer and/or a position of the second wafer are adjusted until the distance between the first wafer and the second wafer satisfies the predetermined bonding distance.

In the embodiment of the present disclosure, the first bearing table and/or the second bearing table may be moved in a direction perpendicular to the first wafer and/or the second wafer so that the relative distance between the first wafer and the second wafer satisfies the predetermined bonding distance. For example, the first bearing table remains stationary, and the second bearing table is moved to reduce the relative distance between the first wafer and the second wafer until the relative distance satisfies the predetermined bonding distance; or the second bearing table remains stationary, and the first bearing table is moved to reduce the relative distance between the first wafer and the second wafer until the relative distance satisfies the predetermined bonding distance; or the first bearing table and the second bearing table are moved to reduce the relative distance between the first wafer and the second wafer until the relative distance satisfies the predetermined bonding distance etc.

It should be noted that the above-mentioned predetermined bonding distance needs to be determined according to practical bonding conditions and production requirements. The optical source of the above-mentioned transmissive optical beam may be kept off during the movement of the bearing table, so that the cost is saved and the loss of device is reduced. The optical source of the transmissive optical beam is turned on to perform the second alignment after the relative distance between the first wafer and the second wafer satisfies a predetermined bonding distance.

In some embodiments, the relative position between the first wafer and the second wafer is adjusted with the transmissive optical beam, which includes the following operations.

A first transmission image of the first alignment mark and the second alignment mark on a side on which the transmissive optical beam emerges (e.g., travels away) from the first wafer and the second wafer is acquired.

The relative position between the first wafer and the second wafer is adjusted according to the first transmission image.

Figure 8A:
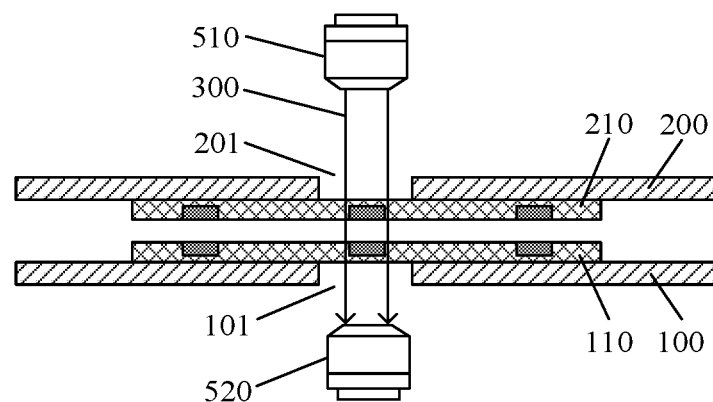
FIGS. 8A and 8B are structural diagrams of determining relative position parameters on the basis of transmission image according to an embodiment of the present disclosure.

As shown in FIG. 8A, in the embodiment of the present disclosure, a lens 510 and a lens 520 for alignment may be provided on one and the other side of the first wafer 110 and the second wafer 210, respectively, the two lenses may be located in the z-axis direction of the coordinate system, and a connection line between the lens 510 and the lens 520 are perpendicular to surfaces of the first wafer 110 and the second wafer 210. For example, the lens 510, as an optical source, may emit the transmissive optical beam 300, and the lens 520, as an observation mirror, may receive the transmissive optical beam 300. Since the transmissive optical beam may penetrate the wafers, the transmissive optical beam passing through the first wafer and the second wafer can be received by the observation mirror on a side opposite to the optical source, and the transmission image of the first alignment mark and the second alignment mark, that is, the first transmission image, can be acquired. The first transmission image herein refers to an image acquired on the side opposite to the optical source after the transmissive optical beam emerges (e.g., travels away) from the first wafer and the second wafer. The image includes a first projection image of the first alignment mark on the first wafer and a second projection image of the second alignment mark on the second wafer. That is, the optical source emitting the transmissive optical beam and the observation mirror collecting the first transmission image are located on one and the other side of the wafers, respectively.

Figure 8B:
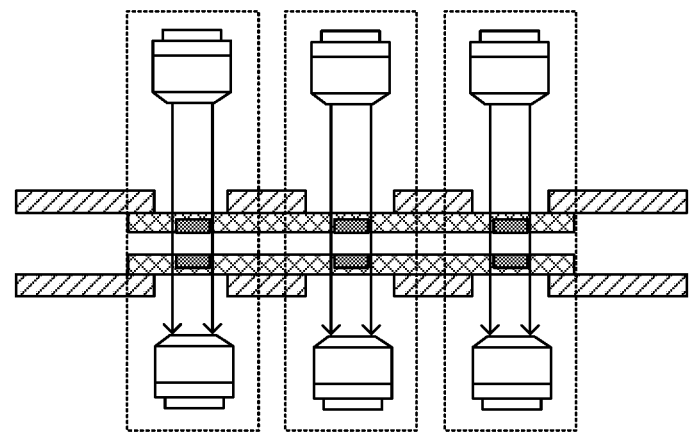

It should be noted that in some embodiments, as shown in FIG. 8B, at least one set of lenses for alignment as described above may be included. Each set of lenses herein corresponds to a set of alignment marks on the first wafer and the second wafer, that is, a relative position parameter can be determined by the first transmission image of the corresponding first alignment mark and the second alignment mark formed at corresponding positions. For example, in the case where alignment marks are located at edges of a wafer, the set of lenses is also located above the bearing table at a position corresponding to the edge of the wafer, and in the case where the alignment marks are located at the center of the wafer, the set of lenses is also located above the bearing table at a position corresponding to the center of the wafer.

The relative position parameter of the first alignment mark and the second alignment mark in the first coordinate system and the second coordinate system may be determined according to a transmission image acquired by the observation mirror. Herein, the relative position parameter may be a coordinate parameter. The relative coordinate position of the first wafer and the second wafer may be further adjusted.

In some embodiments, the first transmission image includes: a first projection image of the first alignment mark and a second projection image of the second alignment mark.

In the embodiments of the present disclosure, when the transmissive optical beam passes through the first wafer, the first alignment mark is opaque. Thus, the projection of the first alignment mark on the xy plane in the first coordinate system is formed, which is the first projection image. Similarly, when the transmissive optical beam passes through the second wafer, the second alignment mark is opaque. Thus, the projection of the second alignment mark on the xy plane in the second coordinate system is formed, which is the second projection image. For example, when the transmissive optical beam irradiates a surface of the first wafer and emerges (e.g., travels away) from the back surface of the irradiation surface of the second wafer, the first projection image is a projection image of the first alignment mark in the observation mirror when the transmissive optical beam passes through the first wafer and the second wafer, and the second projection image is a projection image of the second alignment mark in the observation mirror when the second type of optical beam passes through the second wafer. It should be noted that the first transmission image herein needs to be determined according to the pattern of the first alignment mark and the second alignment mark. When the first projection image and the second projection image overlap, the overlapping projection image is acquired in the observation mirror.

In some embodiments, the relative position between the first wafer and the second wafer is adjusted with the transmissive optical beam, which includes the following operations.

A first reflection image formed by reflection of the first alignment mark and the second alignment mark is acquired on a side on which the transmissive optical beam irradiates the first wafer.

The relative position between the first wafer and the second wafer is adjusted according to the first reflection image.

Figure 9A:
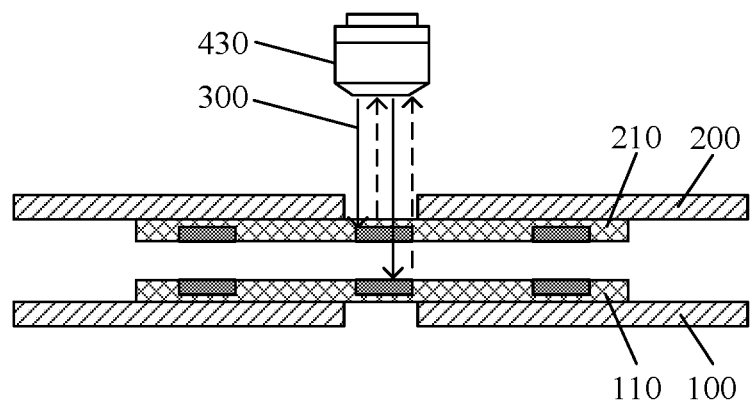
FIGS. 9A and 9B are structural diagrams of determining relative position parameters on the basis of reflection image according to an embodiment of the present disclosure.

As shown in FIG. 9A, in the embodiments of the present disclosure, an integrated lens 430 for the alignment may be provided on one side of the first wafer 110 or the second wafer 210, and the integrated lens 430 may be located in the direction of z axis of the coordinate system. Furthermore, the integrated lens 430 may integrate an optical source and an observation mirror, so that the transmissive optical beam 300 may be emitted and received by the integrated lens 430. Here, for example, the transmissive optical beam may irradiate the surface of the second wafer, herein a portion of the optical beam may be reflected at the second alignment mark and be acquired by the observation mirror; another portion of the optical beam may pass through the second wafer and irradiate the first wafer, and may be reflected at the first alignment mark and be acquired by the observation mirror which is at the same side with the optical source. The reflection image reflected at the first alignment mark and the second alignment mark is the first reflection image. It should be noted that the first reflected image here is an image received on the side of the optical source, which is formed by the reflection of the transmissive optical beam the at the first alignment mark and the second alignment mark after the transmissive optical beam irradiates the first wafer and the second wafer. The first reflected image includes a reflection projection image of the opaque part of the first alignment mark in the observation mirror and a reflection projection image of the opaque part of the second alignment mark in the observation mirror.

Figure 9B:
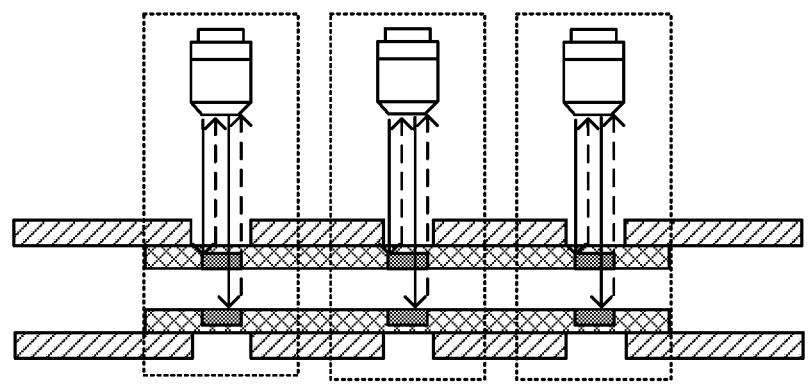

It should be noted that in some embodiments, as shown in FIG. 9B, the aforementioned integrated lens for the alignment may include at least one set of lenses. Each set of integrated lenses includes optical sources and observation mirrors. Each set of lenses here corresponds to a set of alignment marks on the first wafer and the second wafer, that is, the relative position parameter can be determined by the first reflection image of the corresponding first alignment mark and the second alignment mark formed at the corresponding positions. For example, in the case where the alignment marks are located at the edge of the wafer, the set of lenses are also located above the bearing table at the position corresponding to the edge of the corresponding wafer, and in the case where the alignment marks are located at the center of the wafer, the set of lenses are also located above the bearing table at the position corresponding to the center of the corresponding wafer.

Similarly, the relative position parameter of the first alignment mark and the second alignment mark in the first coordinate system and the relative position parameter of the first alignment mark and the second alignment mark in the second coordinate system may be determined according to the reflection image in the observation mirror. Here, the relative position parameters may be coordinate parameters. Next, the relative coordinate position of the first wafer and the second wafer is further adjusted.

In some embodiments, the first reflection image includes:
a third projection image of the first alignment mark and a fourth projection image of the second alignment mark In the embodiments of the present disclosure, when the transmissive optical beam is reflected at the first alignment mark on the first wafer, there may be a projection on the xy plane in the first coordinate system, that is, the third projection image. Similarly, when the transmissive optical beam is reflected at the second alignment mark on the second wafer, there may be a projection on the xy plane in the second coordinate system, that is, the fourth projection image. For example, when the transmissive optical beam irradiates the surface of the first wafer, the third projection image is a projection image formed by the reflection of the transmissive optical beam at the irradiation surface of the first alignment mark, which can be acquired in the observation mirror, and the fourth projection image is a projection image formed by reflection of the transmissive optical beam at the irradiation surface of the second alignment mark after passing through the first wafer, which can be acquired in the observation mirror.

It should be noted that the first reflection image here needs to be determined according to the pattern of the first alignment mark and the second alignment mark. When the first alignment mark and the second alignment mark have the same size and pattern, after the alignment of the first wafer and the second wafer, only the projection image of the alignment mark near the side of the optical source can be acquired in the observation mirror.

In some embodiments, the first alignment mark includes a first alignment reference point, and the second alignment mark includes a second alignment reference point. Causing the relative position between the first alignment mark and the second alignment mark to satisfy the predetermined bonding condition, includes the following operation: a first distance between the first alignment reference point and the second alignment reference point in a first direction is made to be less than or equal to a first distance threshold; and/or a second distance between the first alignment reference point and the second alignment reference point in a second direction is made to be less than or equal to a second distance threshold.

Herein, the first direction and the second direction are parallel to the surface of the first wafer and/or the surface of the second wafer; the first direction is perpendicular to the second direction.

The position parameter in the embodiment of the present disclosure may be a coordinate parameter. Therefore, the relative position parameter may be a relative coordinate parameter of the first alignment mark and the second alignment mark. For example, the pattern of the first alignment mark may have a first alignment reference point, and the pattern of the second alignment mark may have a second alignment reference point. Herein the alignment reference point may be selected according to actual requirements, such as, a center of the pattern or a specific point in the pattern or the like. A planar rectangular coordinate system may be established in the observation mirror. In the same coordinate system, the first alignment reference point may have a first coordinate point, and the second alignment reference point may have a second coordinate point. The first alignment reference point and the second alignment reference point may have a corresponding distance length in the same direction (x direction or y direction) of the above-mentioned coordinate system.

For example, the first direction may be the x direction of the coordinate system, and an absolute value of the difference of the x-coordinates of the first alignment reference point and the second alignment reference point is the first distance; the second direction may be the y direction of the coordinate system, and an absolute value of the difference of the y-coordinates of the first alignment reference point and the second alignment reference point is the second distance. When the first distance is greater than the first distance threshold, the first wafer and the second wafer are misaligned; when the second distance is greater than the second distance threshold, the first wafer and the second wafer are also misaligned. The process of the first alignment of the first wafer and the second wafer is a process of adjusting the relative position between the first wafer and the second wafer such that the first distance is less than or equal to the first distance threshold and/or the second distance is less than or equal to the second distance threshold. When both the first distance and the second distance are required to be less than or equal to the corresponding distance thresholds, the relative position parameters of the first wafer and the second wafer in the x direction and the y direction need to be adjusted. When one of the first distance or the second distance is required to be less than or equal to the corresponding distance threshold, only the relative position parameter of the first wafer and the second wafer in the corresponding coordinate direction needs to be adjusted. Here the adjustment of the relative position parameter may be realized by fixing the first wafer and adjusting the second wafer, or by fixing the second wafer and adjusting the first wafer, or by adjusting the first wafer and the second wafer simultaneously until first alignment of the first alignment mark with the second alignment mark is completed.

It should be noted that the above-mentioned alignment conditions need to be determined according to actual requirements. For example, the process of the first alignment mentioned above may be coarse alignment, that is, a larger first distance threshold and a larger second distance threshold are used as alignment conditions, and the process of the second alignment may be refined alignment, that is, a smaller first distance threshold and a smaller second distance threshold are used as alignment conditions. In this way, steps for alignment can be reduced; the costs can be saved, and the product reliability can be improved.

In the embodiment of the present disclosure, one of the first distance or the second distance may be selected as the relative position parameter, or the first distance and the second distance may be selected together as the relative position parameter, so that the error of the above-mentioned relative position parameter may be reduced by averaging multiple calculations. The first direction and the second direction may be perpendicular to each other in a direction parallel to the first wafer and/or the second wafer, such as, the x direction and the y direction of the coordinate system. In this way, it is convenient to calculate the values of the first distance and the second distance to improve the accuracy of the calculation, so that the accuracy of the second alignment can be improved.

In some embodiments, the first alignment mark includes a first alignment reference point, and the second alignment mark includes a second alignment reference point. Causing the relative position between the first alignment mark and the second alignment mark to satisfy the predetermined bonding condition includes the following operation: a third distance between the first alignment reference point and the second alignment reference point in the vertical direction is made to be less than or equal to a third distance threshold.

The relative position of the embodiment of the present disclosure may be a third distance perpendicular to the surface of the first wafer and/or the second wafer, that is, the z direction corresponding to the coordinate system. For example, when the third distance is required to be less than or equal to the corresponding third distance threshold, the relative position parameters of the first wafer and the second wafer in the z direction need to be adjusted. For example, the adjustment of the relative position parameter may be realized by fixing the first wafer and adjusting the second wafer, or by fixing the second wafer and adjusting the first wafer, or by adjusting the first wafer and the second wafer simultaneously until the third distance between the first alignment reference point and the second alignment reference point is less than or equal to a corresponding third distance threshold. Here, the third distance threshold may be the predetermined bonding distance described above, and needs to be determined according to actual bonding conditions.

In some embodiments, the transmissive optical beam may be infrared light.

In the embodiment of the present disclosure, the infrared light with a wavelength range of 700 nm to 4000 nm may be selected as the transmissive optical beam. This is because the wavelength of the infrared light is longer than that of the visible light and the penetration capability is strong, so that the transmissive optical beam can effectively penetrate the wafer and maintain a strong signal. In addition, the infrared light signal has strong anti-interference performance, which facilitates observation of the image, thereby improving accuracy of wafer alignment and reliability of the product.

In conclusion, the wafer bonding method provided in the embodiment of the present disclosure can determine the first position parameter of the first wafer and the second position parameter of the second wafer with the transmissive optical beam, and further adjust the relative position between the first wafer and the second wafer so that the relative position of the first alignment mark on the first wafer and the second alignment mark on the second wafer may satisfy the predetermined bonding conditions. On one hand, the process steps that need to be operated in the wafer alignment process and the position errors generated in the wafer movement process are reduced; on the other hand, the anti-interference performance of the signal and the definition of optical imaging can be improved by use of the transmissive optical beams. Thus, accuracy of wafer bonding and reliability of the product can be improved.

Figure 10:
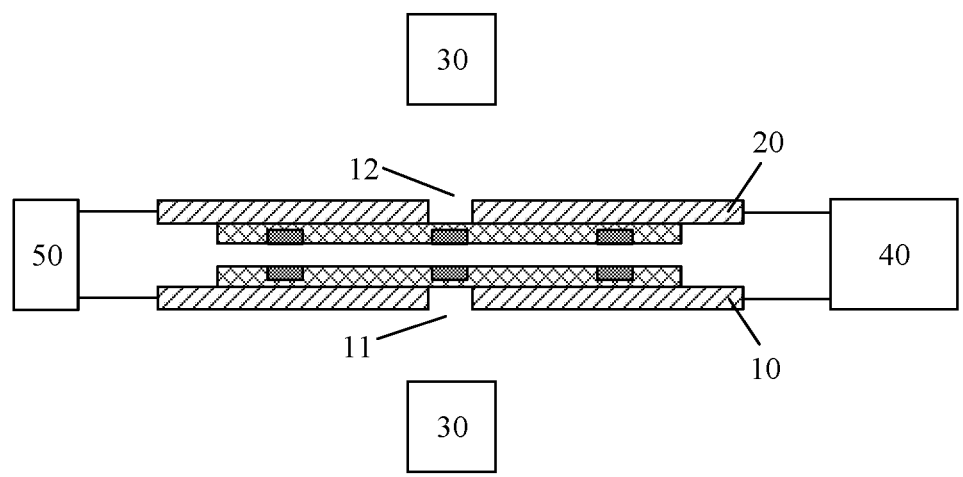
FIG. 10 is a structural diagram of a wafer bonding apparatus according to an embodiment of the present disclosure.

As shown in FIG. 10, an embodiment of the present disclosure further provides a wafer bonding apparatus, including a first bearing table 10, a second bearing table 20, an alignment component 30, a mobile component 40, and a bonding component 50.

The first bearing table 10 is configured to hold a first wafer. Herein, the first wafer is provided with at least one first alignment mark.

The second bearing table 20 is opposite to the first bearing table, and configured to hold a second wafer. Herein, the second wafer is provided with at least one second alignment mark.

The alignment component 30 is located on a side of the first bearing table and/or a side of the second bearing table, and configured to determine a first position parameter of the first alignment mark on the first wafer by using a transmissive optical beam.

The alignment component is further configured to determine a second position parameter of the second alignment mark on the second wafer with the transmissive optical beam.

The mobile component 40 is connected to the bearing tables, and configured to adjust, according to the first position parameter and the second position parameter, a relative position between the first wafer and the second wafer with the transmissive optical beam, until the relative position between the first alignment mark and the second alignment mark satisfies a predetermined bonding condition.

The bonding component 50 is connected to the first bearing table 10 and the second bearing table 20, and configured to bond the first wafer to the second wafer.

The bearing table in the embodiments of the present disclosure may include, but is not limited to, a vacuum chuck, a chuck, a robot arm, or the like, and may be freely moved according to the requirements of an operator. Herein the type and the size of the first bearing table and the second bearing table may be the same or different. For example, the first bearing table may be a chuck configured to hold the first wafer, and the second bearing table may be a robot arm that holds and moves the second wafer freely. It should be noted that the first bearing table and the second bearing table are disposed opposite to each other during the process of the alignment and the bonding of the wafers, and the first bearing table may be disposed below the second bearing table or may be disposed above the second bearing table.

The alignment component of the embodiments of the present disclosure may include one or more of an optical source, an observation mirror, or other optical component that can be used for alignment, and may be an optical component integrating an optical source and an observation mirror. The alignment component may be positioned on a side on which the bearing table bears the wafers or a side opposite to side on which the bearing table bears the wafers. During the actual alignment, the spatial rectangular coordinate system may be established with the alignment components as the coordinate origins, so that the position parameters of the alignment marks on the wafer may be converted into the coordinate parameters, and the distance between the coordinates may be used to control the moving distance of the wafer. Specifically, the embodiment of the present disclosure includes a mobile component to connect the bearing tables to control movement of the wafers such that alignment marks on the first wafer and the second wafer are aligned with each other and the projections on the corresponding coordinate systems at least partially overlap.

In the embodiments of the present disclosure, the mobile component may control the bearing table to perform the alignment and move the first wafer and the second wafer to the position to be bonded after the alignment. Then the alignment is performed according to the relative position parameter of the first alignment mark and the second alignment mark. After the second alignment, the bonding component may bond the first wafer and the second wafer satisfying the bonding conditions (located at the position to be bonded and aligned). It should be noted that the above-described two alignment processes may include the first alignment of moving the bonding surface of the first wafer and the bonding surface of the second wafer to an opposing position, and the second alignment of adjusting the first alignment reference point and the second alignment reference point to satisfy the alignment conditions on the basis that the bonding surface of the first wafer is opposite to the bonding surface of the second wafer before the bonding operation.

Therefore, the bonding apparatus provided in the embodiment of the present disclosure can hold the first wafer by the first bearing table or hold the second wafer by the second bearing table before the bonding operation, and then perform the wafer alignment twice by the transmissive optical beam, so that the wafer bonding and alignment process steps can be reduced, and the position error generated during the movement of wafers can be reduced. Thus, the accuracy of wafer bonding and the product reliability can be improved.

In some embodiments, the first bearing table 10 includes at least one first opening 11 at a position corresponding to the first alignment mark.

The second bearing table 20 includes at least one second opening 21 at a position corresponding to the second alignment mark.

In the embodiments of the present disclosure, the bearing table may be opaque. Therefore, at least one patterned opening may be provided on the first bearing table and the second bearing table so that the transmissive optical beam may be irradiated onto the surface of the wafers through the openings. It should be noted that multiple openings may have the same pattern and size, and may be spaced at an equal and spacing. For example, during the first alignment, the first opening on the first bearing table and the second opening on the second bearing table may be located on the optical axis of the transmissive optical beam. Thus, the position parameters of the corresponding alignment marks can be obtained more accurately through the alignment component.

In some embodiments, as shown in FIG. 11A to FIG. 11F, the alignment component 30 includes a first light-emitting unit 31 and a first receiving unit 32.

The first light-emitting unit 31 is located on a side of the first bearing table 10 or a side of the second bearing table 20, and configured to emit the transmissive optical beam. Herein, the transmissive optical beam has a property of transmitting through a wafer.

The first receiving unit 32 is located on a side of the wafer opposite to a side of the wafer on which the first light-emitting unit 31 is located, and configured to receive the transmissive optical beam passing through the first wafer and the second wafer.

In the embodiment of the present disclosure, the alignment components may be located on both sides of the first wafer and the second wafer; here one side refers to the side away from the side on which the bearing table bears the wafers. In addition, for example, the first light-emitting unit may be an optical source configured to emit a transmissive optical beam; the first receiving unit may be a CCD observation mirror configured to receive the transmissive optical beam. It should be noted that the transmissive optical beam may be irradiated parallel to the wafer surface according to the actual requirements. Therefore, the first light-emitting unit and the first receiving unit may be located on the optical path on which the light port is located.

Figure 11A:
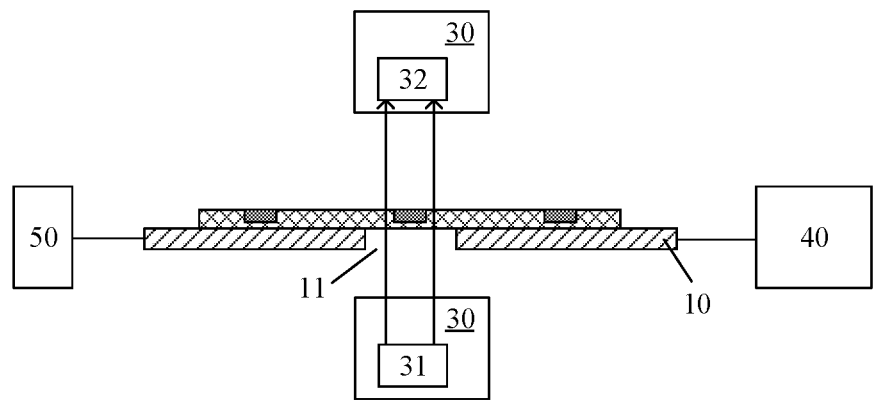
FIGS. 11A to 12F are optional structural diagrams of alignment component according to an embodiment of the present disclosure.
Figure 11B:
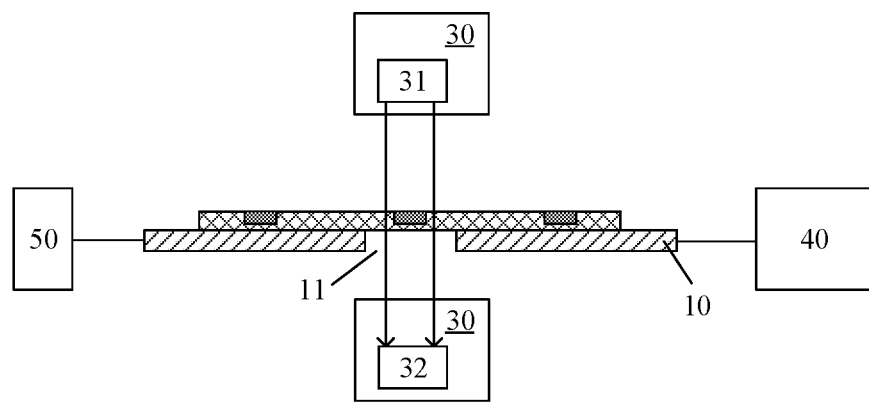

For example, as shown in FIGS. 11A and 11B, each of the first light-emitting unit 31 and the first receiving unit 32 may be located on a respective side of the first bearing table 10 for determining the first position parameter of the first alignment mark on the first wafer. As shown in FIG. 11A, the first light-emitting unit 31 is located on the side away from the bearing surface of the first bearing table 10, and the first receiving unit 32 is located on the side of the bearing surface of the first bearing table 10. Thus, the transmissive optical beam can directly irradiate the first wafer through the first opening 11 after being emitted by the first light-emitting unit 31 and pass through the first wafer, so that the projection of the first alignment mark is received by the first receiving unit 32. Accordingly, as shown in FIG. 11B, the first light-emitting unit 31 is located on the side of the bearing surface of the first bearing table 10, and the first receiving unit 32 is located on the side away from the bearing surface of the first bearing table 10. Thus, the transmissive optical beam can be directly irradiated on the first wafer after being emitted by the first light-emitting unit 31, and pass through the first wafer and the first opening 11, so that the projection of the first alignment mark is received by the first receiving unit 32.

Figure 11C:
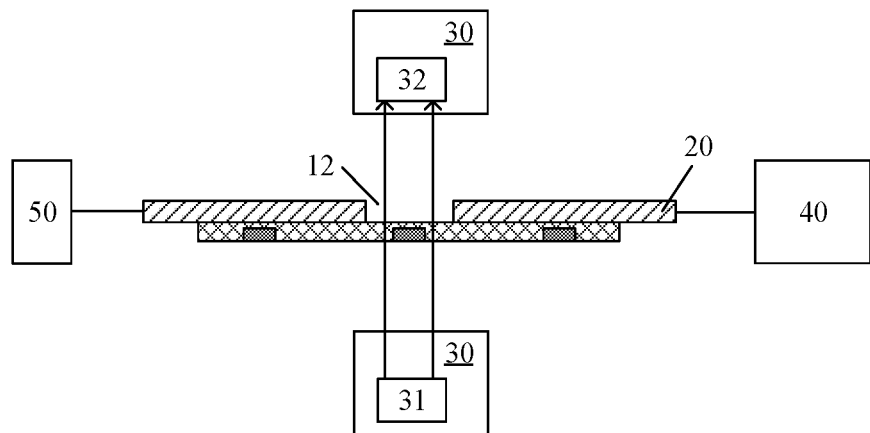
Figure 11D:
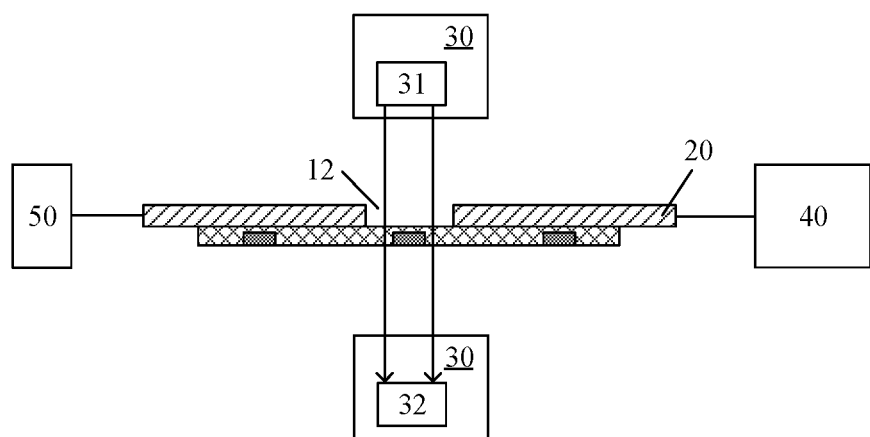

For example, as shown in FIGS. 11C and 11D, each of the first light-emitting unit 31 and the first receiving unit 32 may be located on a respective side of the second bearing table 20 for determining the second position parameter of the second alignment mark on the second wafer. As shown in FIG. 11C, the first light-emitting unit 31 is located on the side of the bearing surface of the second bearing table 20, and the first receiving unit 32 is located on the side away from the bearing surface of the second bearing table 20. Thus, the transmissive optical beam can directly irradiate the second wafer through the second opening 12 after being emitted by the first light-emitting unit 31 and pass through the second wafer, so that the projection of the second alignment mark is received by the first receiving unit 32. Accordingly, as shown in FIG. 11D, the first light-emitting unit 31 is located on the side away from the bearing surface of the second bearing table 20, and the first receiving unit 32 is located on the side of the bearing surface of the second bearing table 20. Thus, the transmissive optical beam can irradiate the second wafer from the first light-emitting unit 31 through the second opening 12, and pass through the second wafer, so that the projection of the second alignment mark is received by the first receiving unit 32.

Figure 11E:
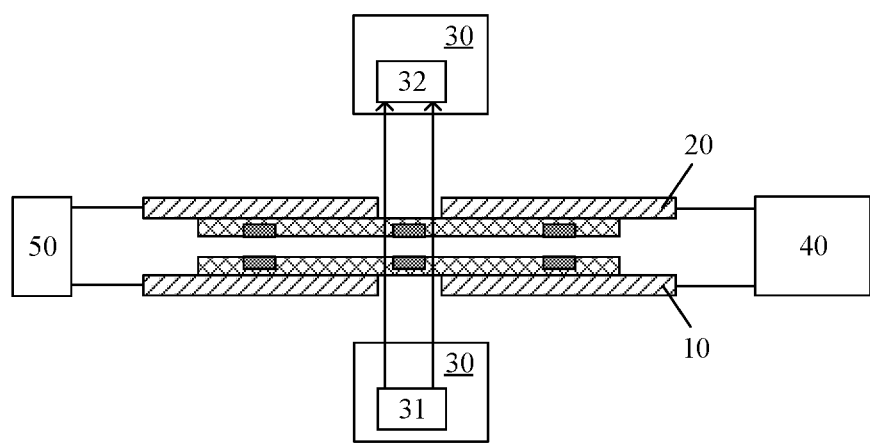
Figure 11F:
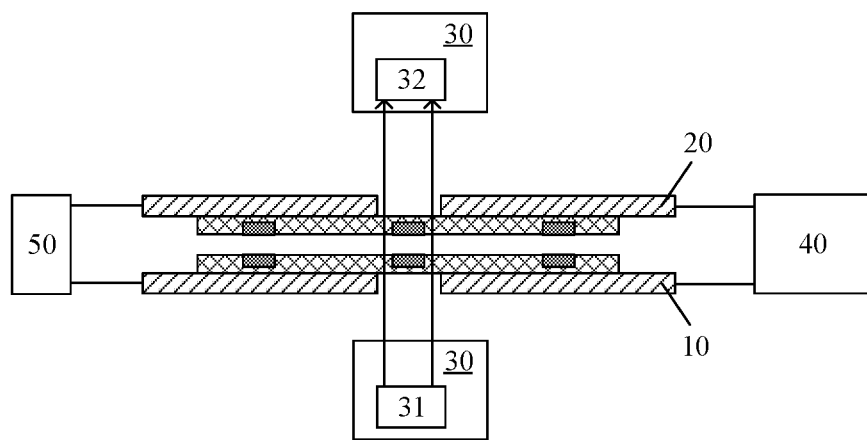

For example, as shown in FIGS. 11E and 11F, each of the first light-emitting unit 31 and the first receiving unit 32 may be located on a respective side of the first bearing table 10 and the second bearing table 20, so that the transmissive optical beam emitted by the first light-emitting unit 31 may irradiate the surface of the first wafer and the surface of the second wafer through an opening on one side, project the transmission image of the first alignment mark and the second alignment mark and radiate into the first receiving unit 32 through an opening on the other side.

In some embodiments, as shown in FIGS. 12A to 12F, the alignment component includes a second light-emitting unit 33 and a second receiving unit 34.

The second light-emitting unit 33 is located on a side of the first bearing table 10 or a side of the second bearing table 20, and configured to emit the transmissive optical beam, herein the transmissive optical beam has a property of transmitting through a wafer.

The second receiving unit 34 is located on a same side as the second light-emitting unit 33, and configured to receive the transmissive optical beam reflected at the first alignment mark and the second alignment mark.

In the embodiment of the present disclosure, for example, the alignment component may be located on either side of the first bearing table or the second bearing table. Here, the side refers to the side on which the bearing table bears the wafer. Likewise, the second light-emitting unit may be an optical source configured to emit a transmissive optical beam, and the second receiving unit may be a CCD observation mirror configured to receive the transmissive optical beam. It should be noted that the transmissive optical beam may be irradiated parallel to the wafer surface according to actual requirements.

Figure 12A:
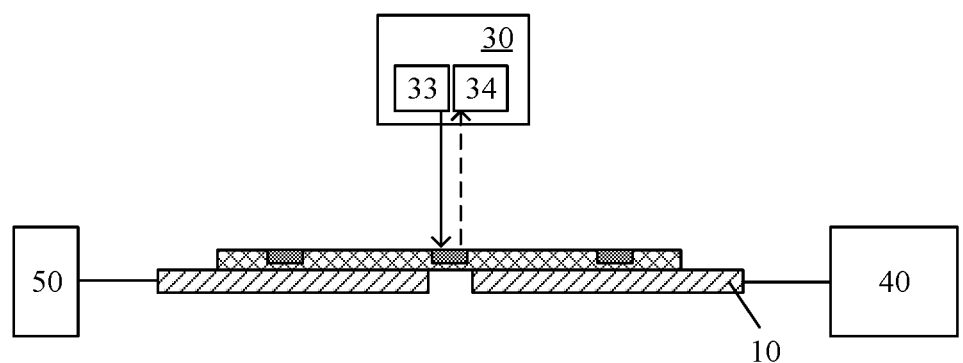
Figure 12B:
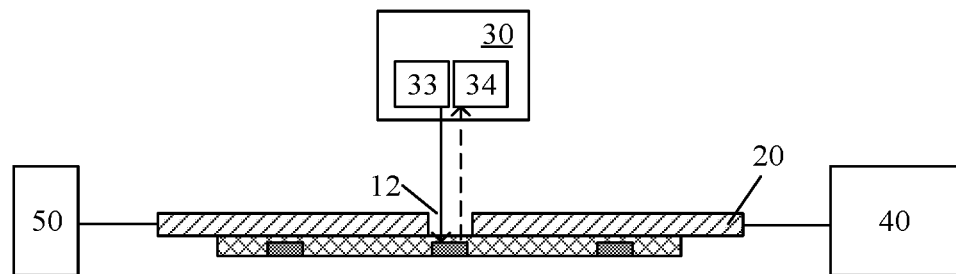

For example, as shown in FIGS. 12A and 12B, the second light-emitting unit 33 and the second receiving unit 34 may be located on the same side of the first bearing table 10 for determining the first position parameter of the first alignment mark on the first wafer. As shown in FIG. 12A, when the first bearing table 10 is located in the horizontal direction, the first wafer is located above the first bearing table 10, and the second light-emitting unit 33 and the second receiving unit 34 may be located on the side of the bearing surface of the first bearing table 10, so that the transmissive optical beam may be emitted by the second light-emitting unit 33, irradiated onto the surface of the first wafer, reflected by the opaque portion of the first alignment mark, and finally received by the second receiving unit 34. Correspondingly, as shown in FIG. 12B, the second bearing table 20 is also located in the horizontal direction and the second wafer is located below the second bearing table 20. The second light-emitting unit 33 and the second receiving unit 34 may be located on the side away from the bearing surface of the second bearing table 20, so that the transmissive optical beam may be emitted by the second light-emitting unit 33, irradiated onto the surface of the second wafer through the second opening 12, reflected by the opaque portion of the second alignment mark, and finally received by the second receiving unit 34 after passing through the second opening 12 again.

Figure 12C:
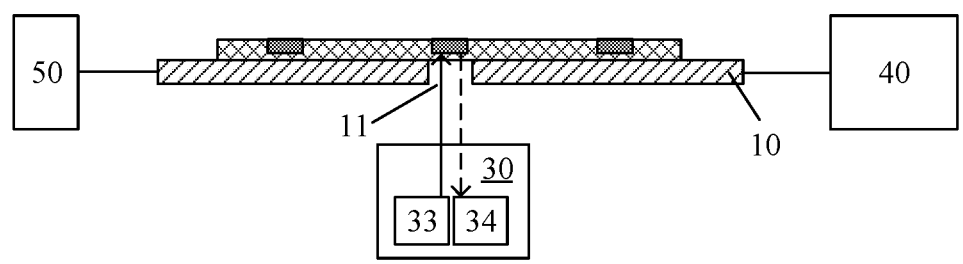
Figure 12D:
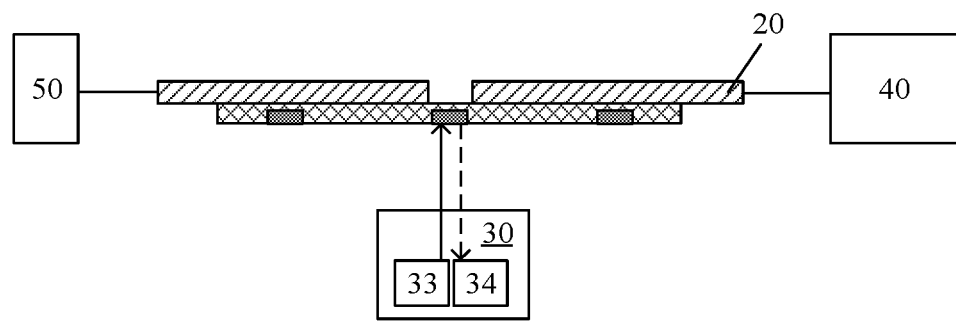

For example, as shown in FIGS. 12C and 12D, the second light-emitting unit 33 and the second receiving unit 34 may be located on the same side of the second bearing table 20 for determining the second position parameter of the second alignment mark on the second wafer. As shown in FIG. 12C, the second light-emitting unit 33 and the second receiving unit 34 may be positioned on the side away from the bearing surface of the first bearing table 10 so that the transmissive optical beam is irradiated onto the surface of the first wafer through the first opening 11, emitted through the first opening 11 after being reflected by the opaque portion of the first alignment mark, and received by the second receiving unit 34. Accordingly, as shown in FIG. 12D, the transmissive optical beam may be emitted by the second light-emitting unit 33, irradiated onto the surface of the second wafer, reflected by the opaque portion of the second alignment mark, and finally received by the second receiving unit 34.

Figure 12E:
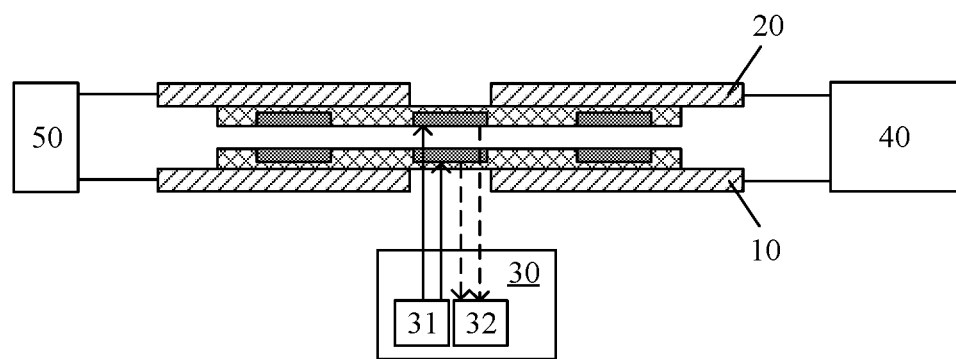
Figure 12F:
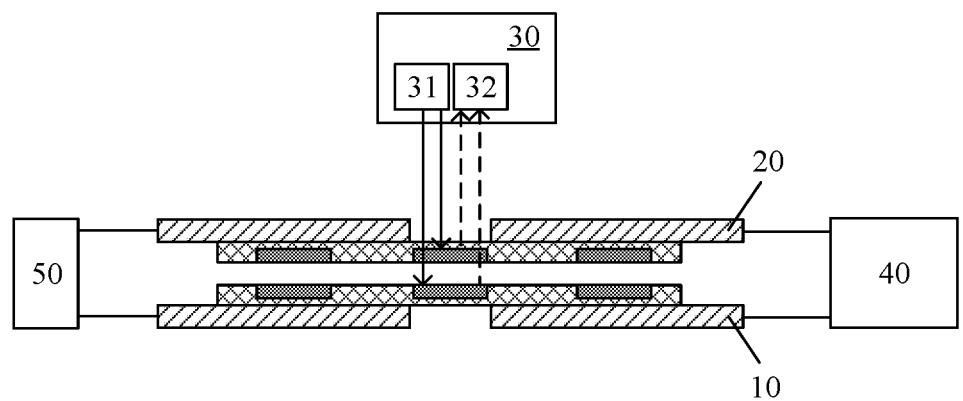

For example, as shown in FIGS. 12E and 12F, the second light-emitting unit 33 and the second receiving unit 34 may be located on the same side of the first bearing table 10 and the second bearing table 20, so that the transmissive optical beam may be emitted by the second light-emitting unit 33, irradiated onto the surfaces of the first wafer and the second wafer through the opening on either side, form a projection of reflection images of the first alignment mark and the second alignment mark and finally irradiated into the second receiving unit 34 through the same opening.

It should be noted that the features disclosed in the several method or apparatus embodiments of the present disclosure may be combined arbitrarily without conflict to obtain a new method or apparatus embodiment.

The foregoing descriptions are merely specific embodiments of the present disclosure, but the scope of protection of the present disclosure is not limited thereto. Any change or replacement readily contemplated by a person skilled in the art within the technical scope disclosed in the present disclosure shall fall within the scope of protection of the present disclosure. Accordingly, the scope of protection of the present disclosure shall be subject to the scope of protection of the claims.

The invention claimed is:

1. An apparatus for wafer bonding, comprising:
   a first bearing table, configured to hold a first wafer, wherein the first wafer is provided with at least one first alignment mark;
   a second bearing table, opposite to the first bearing table, and configured to hold a second wafer, wherein the second wafer is provided with at least one second alignment mark;
   an alignment component, located on at least a side of the first bearing table or a side of the second bearing table, and configured to determine a first position parameter of the first alignment mark on the first wafer by using an optical beam and determine a second position parameter of the second alignment mark on the second wafer with the optical beam;
   a mobile component, connected to the first bearing table and the second bearing table, and configured to adjust, according to the first position parameter and the second position parameter, a relative position between the first wafer and the second wafer until a relative position between the first alignment mark and the second alignment mark satisfies a predetermined bonding condition, wherein the mobile component is configured to control the first bearing table and the second bearing table to:
      adjust, with the optical beam being turned on, a horizontal position of the first wafer and a horizontal position of the second wafer in a horizontal direction,
      adjust, with the optical beam being turned off, a vertical position of the first wafer and a vertical position of the second wafer in a vertical direction; and
   a bonding component, connected to the first bearing table and the second bearing table, and configured to bond the first wafer to the second wafer.

2. The apparatus of claim 1, wherein
   the first bearing table comprises at least one first opening at a position corresponding to the first alignment mark; and
   the second bearing table comprises at least one second opening at a position corresponding to the second alignment mark.

3. The apparatus of claim 1, wherein the alignment component comprises:
   a first light-emitting unit, located on a side of the first bearing table or a side of the second bearing table, and configured to emit the optical beam, wherein the optical beam has a property of transmitting through a wafer; and
   a first receiving unit, located on another side of the first bearing table or another side of the second bearing table opposite to the side on which the first light-emitting unit is located, and configured to receive the optical beam passing through the first wafer and the second wafer.

4. The apparatus of claim 1, wherein the alignment component comprises:
   a second light-emitting unit, located on a side of the first bearing table or a side of the second bearing table, and configured to emit the optical beam, wherein the optical beam has a property of transmitting through a wafer; and
   a second receiving unit, located on the side of the first bearing table or the side of the second bearing table as same as the side on which the second light-emitting unit is located, and configured to receive the optical beam reflected at the first alignment mark and the second alignment mark.

5. The apparatus of claim 4, wherein the second light-emitting unit and the second receiving unit are integrated into an integrated lens.

6. The apparatus of claim 3, wherein the first receiving unit is a CCD observation mirror configured to receive the optical beam.

7. The apparatus of claim 4, wherein the second receiving unit is a CCD observation mirror configured to receive the optical beam.

8. The apparatus of claim 3, wherein the first light-emitting unit is located on a first side of the first bearing table that holds the first wafer, and the first receiving unit is located on a second side of the bearing surface of the first bearing table that is opposite to the first wafer.

9. The apparatus of claim 3, wherein the first light-emitting unit is located on a second side of the first bearing table that is opposite to the first wafer, and the first receiving unit is located on a first side of the bearing surface of the first bearing table that holds the first wafer.

10. The apparatus of claim 1, wherein:
    the first bearing table has a first side configured to hold the first wafer;
    the second bearing table has a first side configured to hold the second wafer; and
    the first side of the first bearing table faces the first side of the second bearing table, such that the first wafer and the second wafer are placed between the first bearing table and the second bearing table.

11. The apparatus of claim 10, wherein the alignment component comprises:
    a first light-emitting unit, located on a second side of the first bearing table opposite to the first wafer, and configured to emit the optical beam, wherein the optical beam has a property of transmitting through the first wafer and the second wafer; and
    a first receiving unit, located on a second side of the second bearing table opposite to the second wafer, and configured to receive the optical beam passing through the first wafer and the second wafer.

12. The apparatus of claim 10, wherein the alignment component comprises:
    a second light-emitting unit, located on a second side of the first bearing table opposite to the first wafer or a second side of the second bearing table opposite to the second wafer, and configured to emit the optical beam, wherein the optical beam has a property of transmitting through the first wafer and the second wafer; and
    a second receiving unit, located on the second side of the first bearing table or the second side of the second bearing table as same as the side on which the second light-emitting unit is located, and configured to receive the optical beam reflected at the first alignment mark and the second alignment mark.

13. The apparatus of claim 11, wherein:
    the first bearing table has a plurality of first openings aligned with a plurality of first alignment marks of the first wafer;
    the second bearing table has a plurality of second openings aligned with a plurality of second alignment marks of the first wafer.

14. The apparatus of claim 13, wherein the alignment component comprises:
    a plurality of first light-emitting units aligned with the plurality of the first openings, respectively; and
    a plurality of first receiving units aligned with the plurality of the second openings, respectively.

15. The apparatus of claim 12, wherein:
    the first bearing table has a plurality of first openings aligned with a plurality of first alignment marks of the first wafer;
    the second bearing table has a plurality of second openings aligned with a plurality of second alignment marks of the first wafer.

16. The apparatus of claim 15, wherein the alignment component comprises:
    a plurality of second light-emitting units aligned with the plurality of the first openings, respectively; and
    a plurality of second receiving units aligned with the plurality of the first openings, respectively.

17. The apparatus of claim 15, wherein the alignment component comprises:
    a plurality of second light-emitting units aligned with the plurality of the second openings, respectively; and
    a plurality of second receiving units aligned with the plurality of the second openings, respectively.

18. The apparatus of claim 1, wherein the optical beam is infrared light.

* * * * *